(12) United States Patent
McCollough et al.

(10) Patent No.: US 9,899,980 B2
(45) Date of Patent: *Feb. 20, 2018

(54) SITUATION RESPONSIVE AUDIO SYSTEM

(71) Applicant: Bell Helicopter Textron Inc., Fort Worth, TX (US)

(72) Inventors: James M. McCollough, Arlington, TX (US); Thomas W. Brooks, Hurst, TX (US); David Steinhoff, Kennedale, TX (US); Ottis Lynn Morgan, Arlington, TX (US)

(73) Assignee: BELL HELICOPTER TEXTRON INC., Fort Worth, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/426,085

(22) Filed: Feb. 7, 2017

(65) Prior Publication Data

US 2017/0149402 A1 May 25, 2017

Related U.S. Application Data

(63) Continuation of application No. 13/771,535, filed on Feb. 20, 2013, now Pat. No. 9,584,086.

(51) Int. Cl.
*H03G 3/20* (2006.01)
*H03G 7/00* (2006.01)
(Continued)

(52) U.S. Cl.
CPC .............. *H03G 7/004* (2013.01); *H03G 3/32* (2013.01); *H04R 3/00* (2013.01); *B64D 47/00* (2013.01);
(Continued)

(58) Field of Classification Search
CPC ............ H03G 3/24; H03G 3/32; H03G 3/341; H03G 3/342; H03G 3/344; H03G 3/345; H03G 3/348; H04R 2499/13
See application file for complete search history.

(56) References Cited

U.S. PATENT DOCUMENTS 2,080,554 A 10/1934 Wolff
5,483,692 A 1/1996 Person et al.
(Continued)

FOREIGN PATENT DOCUMENTS

EP 1679233 A2 7/2006
WO 1991002417 A1 2/1991
(Continued)

OTHER PUBLICATIONS

Communication Pursuant to Article 94(3) issued in European Application No. 13162875.2 dated Sep. 16, 2015, 5 pp.
(Continued)

*Primary Examiner* — Duc Nguyen
*Assistant Examiner* — Kile Blair
(74) *Attorney, Agent, or Firm* — Daniel J. Chalker; Edwin S. Flores; Chalker Flores, LLP

(57) ABSTRACT

A method of controlling an audio system includes generating a situation response model for a situation parameter, determining a situation parameter value, and at least one of (1) providing an audio system output as a function of the situation response model and the situation parameter value and (2) receiving an audio system input as a function of the situation response model and the situation parameter value.

20 Claims, 4 Drawing Sheets

(51) Int. Cl.
*H04R 3/00* (2006.01)
*H03G 3/32* (2006.01)
*B64D 47/00* (2006.01)

(52) U.S. Cl.
CPC ...... *H04R 2430/01* (2013.01); *H04R 2499/13* (2013.01)

(56) References Cited

U.S. PATENT DOCUMENTS

| | | |
|---|---|---|
| 5,774,557 A | 6/1998 | Slater |
| 6,493,450 B1 | 12/2002 | Scheuer et al. |
| 6,498,858 B2 | 12/2002 | Kates |
| 6,831,986 B2 | 12/2004 | Kates |
| 8,718,298 B2 | 5/2014 | Prince |
| 2005/0226442 A1 | 10/2005 | Landon et al. |
| 2014/0233759 A1 | 8/2014 | McCollough et al. |

FOREIGN PATENT DOCUMENTS

| | | |
|---|---|---|
| WO | 1999060822 | 11/1999 |
| WO | 2011045782 A1 | 4/2011 |

OTHER PUBLICATIONS

PS Engineering Incorporated, "Aircraft Audio Control Systems—Flying Never Sounded So Good" 16 pp.

SITUATION RESPONSIVE AUDIO SYSTEM

CROSS-REFERENCE TO RELATED APPLICATIONS

This application claims priority to and is a continuation patent application of U.S. patent application Ser. No. 13/771,535 filed on Feb. 20, 2013, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Some vehicles may comprise an audio system configured to provide audio output. In some cases, situational noise may interfere with effective reception of the audio output. Similarly, some vehicles may comprise an audio system configured to selectively receive audio input as a function of a microphone receiving a sound level in excess of a sound level threshold. In some cases, the sound level threshold may undesirably be exceeded by situational noise.

SUMMARY

In some embodiments of the disclosure, a method of controlling an audio system is disclosed as comprising generating a situation response model for a situation parameter, determining a situation parameter value, and at least one of (1) providing an audio system output as a function of the situation response model and the situation parameter value and (2) receiving an audio system input as a function of the situation response model and the situation parameter value.

In other embodiments of the disclosure, an audio system is disclosed as comprising a situation response system, a situation response model, a situation parameter value, and at least one of a situation output device and a situation input device, wherein the situation response system is configured to receive the situation response model and the situation parameter value and wherein the situation response system is further configured to at least one of (1) provide a situation response system output to the situation output device as a function of the situation response model and the situation parameter value and (2) control a situation response system receipt of a situation input device output as a function of the situation response model and the situation parameter value.

In yet other embodiments of the disclosure, an audio system is disclosed as comprising an aircraft information and control system configured to selectively provide a situational parameter value, an audio panel configured to receive the situational parameter value from the aircraft information and control system, and a flight crew audio interface configured to receive an audio output from the audio panel, the audio output comprising a volume selected by the audio panel as a function of the situational parameter value.

BRIEF DESCRIPTION OF THE DRAWINGS

For a more complete understanding of the present disclosure and the advantages thereof, reference is now made to the following brief description, taken in connection with the accompanying drawings and detailed description.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In some cases, it may be desirable to provide an audio system configured to selectively control audio system inputs and audio system outputs as a function of situational conditions. In some embodiments of the disclosure, an audio system is disclosed that comprises a situation response system configured to receive a situation responsive model and a situation parameter value. The situation responsive system may be configured to control a situation response system audio output and/or a situation response system audio input as a function of the situation responsive model and the situation parameter value. In some embodiments, the audio system may alter an audio output of a headset speaker to maintain comfortable and/or effective reception of the audio output even though situational noise levels within a cabin of a vehicle may vary. Similarly, in some embodiments, the audio system may alter an audio input received by the audio system by preventing situational noise levels from triggering transmission of a headset microphone output to the audio system. In some embodiments, the above-described situation responsive system may be configured to operate without directly measuring noise generated by the situational conditions.

Figure 1:
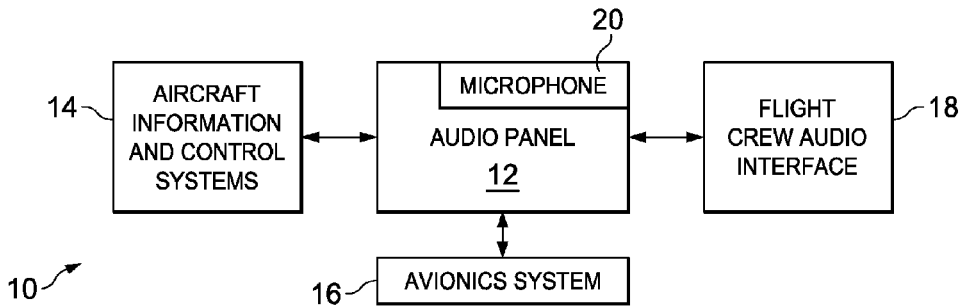
FIG. 1 is a schematic representation of an audio system according to an embodiment of the disclosure.

Referring to FIG. 1, a schematic representation of an audio system 10 according to an embodiment of the disclosure is shown. The audio system 10 may comprise an audio panel 12 configured to receive situation parameter information and/or situation parameter data from an aircraft information and control system 14, an avionics system 16, and/or a flight crew audio interface 18. In some cases, the audio panel 12 may comprise a microphone 20 configured to selectively receive audio inputs related to situation parameters. A situation parameter may comprise any parameter associated with an environment in which the aircraft is located and/or operated, an operational parameter of a mechanical or electrical system of the aircraft, a parameter associated with the construction and/or structural characteristics of the aircraft and/or object carried by the aircraft or sensed by the aircraft, and/or a preference of a pilot, passenger, and/or other user, operator, and/or observer of the aircraft. In this disclosure, the situation parameters are generally characterized as being one or more of an environmental parameter, an operational parameter, a structural parameter, and/or a preference parameter. Most generally, the components of the audio system 10 may cooperate to control an audio output volume level in response one or more of the situation parameters.

The information and/or data provided to the audio panel 12 by the aircraft information and control system 14 may be information regarding an environmental parameter comprising a temperature, a pressure (inside the aircraft and/or outside the aircraft), a weather condition, humidity, an amplitude and/or frequency of air turbulence, a spatial location of the aircraft relative to another object, an altitude of the aircraft, and/or any other parameter associated with the environment generally surrounding the aircraft and/or inside the aircraft. For example, the aircraft information and control system 14 may include flight management systems, engine management systems, environmental systems, environmental sensors, weapons systems, or any other type of internal or external sensor. The aircraft information and control system 14 may provide the audio panel 12 with information regarding an operational parameter comprising any parameter related to power, speed, orientation, flight regime (i.e., whether cruising in an airplane mode, landing, taking off, hovering in a helicopter mode, ascending, descending, etc.), energy consumption, mechanical and/or electrical component actuation, weapons or defensive systems activation, and/or any other transient and/or variable condition of the components of the aircraft and/or components carried by the aircraft, attached to the aircraft, controlled by the aircraft, and/or sensed by the aircraft. The aircraft information and control system 14 may provide the audio panel 12 with information regarding a construction and/or structural parameter comprising a structural stiffness, a material type, a vibration damping characteristic, a material temperature, and/or any other parameter associated with the design materials and/or construction methods used to construct the aircraft.

In some cases, the avionics system 16 may provide information and/or data to the audio panel 12 regarding an avionics parameter. An avionics parameter may comprise navigation information, flight data recorder information, collision-avoidance information, runway guidance information, and/or any other suitable information related to the management of the aircraft. For example, the avionics system 16 may include altimeters, altitude indicators, airspeed indicators, horizontal situation indicators, vertical speed indicators, global positioning system indicators, or any other type of avionic.

The information and/or data provided to the audio panel 12 by the flight crew audio interface 18 may information related to a preference parameter comprising a preferred perceived receptive audio experience (i.e., a preferred speaker and/or headset absolute audio output level or relative audio output level), a preferred sound level threshold for activating the transmission of an audio output of a microphone, a preferred relative audio output level of a first type of audio output (interpersonal voice communications) as compared to a second type of audio output (aircraft system warning audible alerts), and/or any other preference that may be influenced and/or affected by the audio system 10. In some cases, the flight crew audio 18 interface may comprise audio outputs for transmitting sound to speakers, flight crew headsets, earphones, and/or any other suitable audio output device.

Figure 2:
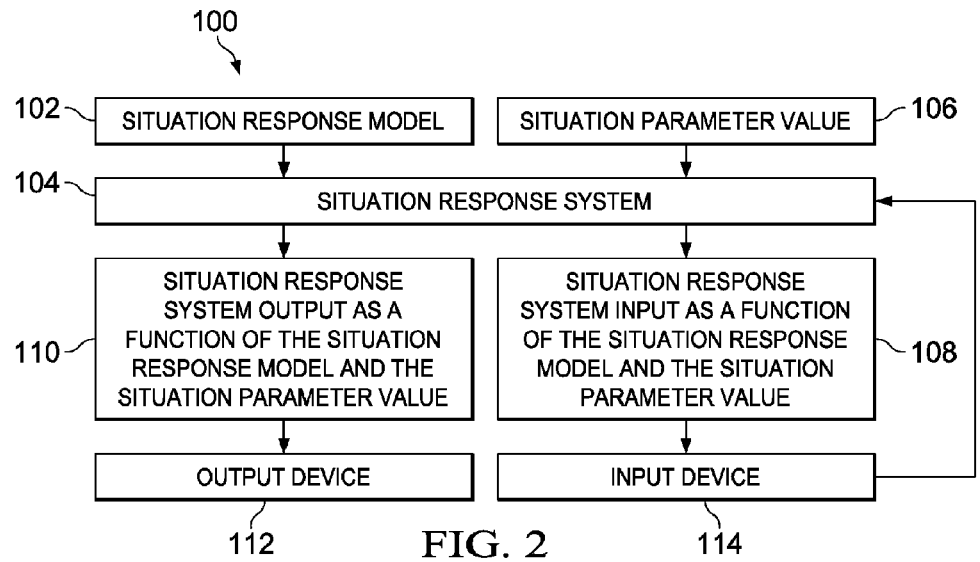
FIG. 2 is a diagram illustrating processing that may occur in an audio panel of the audio system of FIG. 1.

Referring to FIG. 2, a schematic of an embodiment of information processing that may be performed by the audio panel 12 is shown. The audio panel processing 100 may comprise providing a situation response model 102 and a situation parameter value 106 to a situation response system 104. The situation response system 104 may thereafter provide a situation response system output 110 as a function of the situation response model 102 and the situation parameter value 106. The situation response system output 110 may alter an operation of an output device 112, for example, by changing a volume of an audio output device. The situation response system 104 may also or instead provide a situation response system input 108 as a function of the situation response model and the situation parameter value 106. The situation response system input 108 may alter an operation of an input device 114 that may feed the situation response system 104, for example, by changing a volume of an audio input device.

Figure 3:
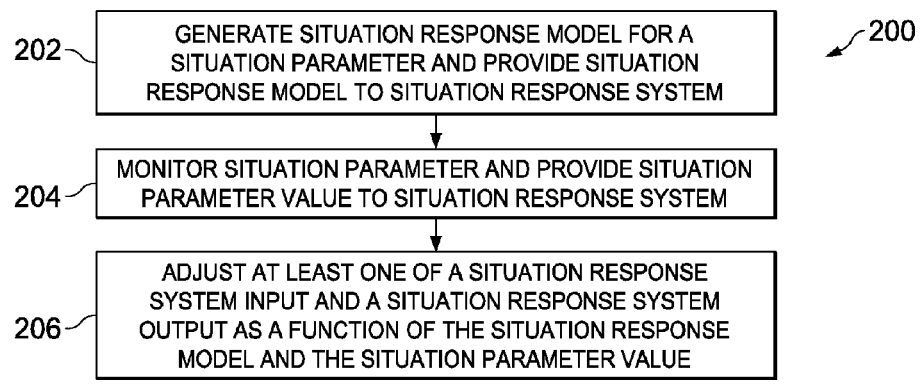
FIG. 3 is a flowchart of a method of controlling the audio system of FIG. 1.

Referring now to FIG. 3, a flowchart of a method 200 of operating the audio panel 12 is shown. The method 200 may begin at block 202 by generating a situation response model, such as situation response model 102 for a situation parameter. In some embodiments, the method 200 may be utilized in the context of controlling an audio system of a vehicle, such as, but not limited to, an aircraft audio system. The situation response models may be obtained through experimentation, computer simulation, generalizations and/or assumptions based on anecdotal information, and/or any other suitable manner in correlating a relationship between the situation parameter and an expected effect on a type of output and/or input of the audio system 10. The situation response model(s) 102 may be provided to the situation response system 104 in the form of look-up tables, spreadsheets, formulas representative of curves fitted to data points, and/or any other suitable manner of conveying at least a portion of the information of the situation response models 102. One or more of the situation response models 102 may be provided to the situation response system 104 of audio panel 12. In some embodiments, the situation response models 102 may be generated in advance of operating the aircraft and/or the audio system 10 of the aircraft. In other embodiments, the situation response models 102 may be learned, calculated, received, and/or revised as a function of operation of the aircraft and/or an audio system 10 of the aircraft.

The method 200 may progress to block 204 where one or more situation parameters may be monitored to obtain situation parameter values 106 that may be provided to the situation response system 104. The situation parameter values 106 may be provided to the situation response system 104 by one or more of the aircraft information and control system 14, avionics system 16, flight crew audio interface 18, and/or microphone 20. In some cases, situation parameter value(s) 106, may be monitored by sensors and/or by accessing a digital data bus associated with one or more of the aircraft information and control system 14, the avionics system 16, the flight crew audio interface 18, and/or the microphone 20.

The method 200 may progress to block 206 where the situation response system 104 may utilize the situation response model(s) 102 and the situation parameter value(s) 106 to adjust a situation response system 104 input 108 and/or a situation response system 104 output 110 as a function of the situation response model(s) 102 and the situation parameter value(s) 106. In some cases, the adjustments may comprise taking the situation response model(s) 102 and the situation parameter value(s) 106 into consideration when adjusting an audio input and/or an audio output in response to variations of the values of the situation parameters. In some cases, the output 110 may be provided to an output device 112, such as, but not limited to, an audio output device. In some cases, the input 108 may comprise adjusting control of an input device 114, such as, but not limited to, an audio input device.

Figure 4:
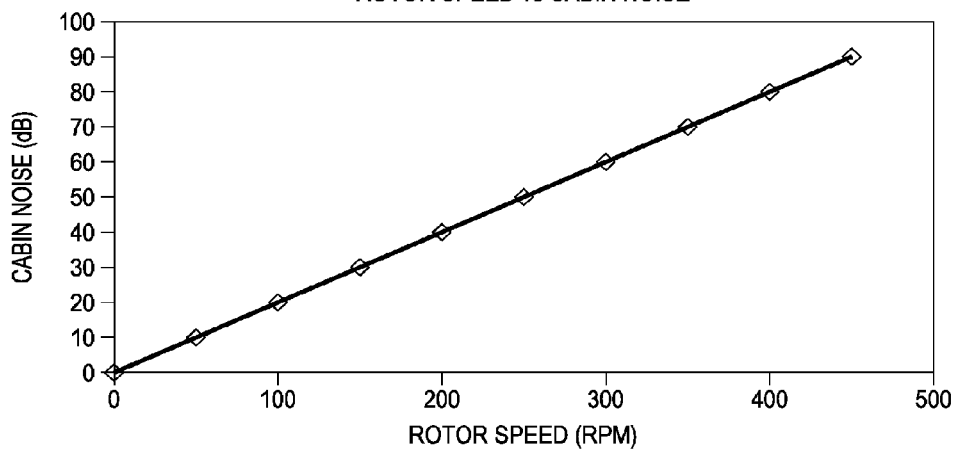
FIG. 4 is a situation parameter model chart associated with a rotor speed.
Figure 5:
FIG. 5 is a situation parameter model chart associated with a weapon initiation.
Figure 6:
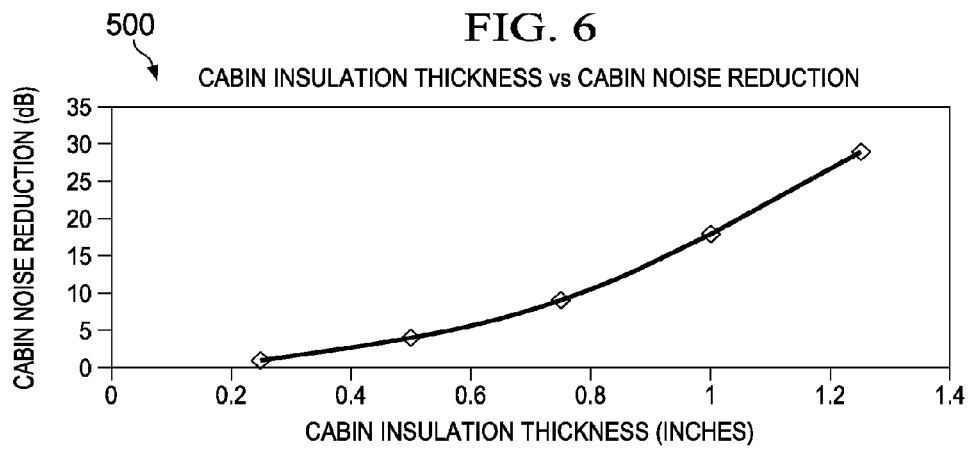
FIG. 6 is a situation parameter model chart associated with a cabin insulation thickness.

Referring now to FIGS. 4-6, charts of situation response models for a rotor speed parameter, a weapon initiation parameter, and a cabin insulation thickness parameter are shown, respectively. Each of the charts of FIGS. 4-6 model a relationship between a situation parameter versus an impact on a cabin noise level. Referring to the chart of FIG. 4, the rotor speed situation response model 300 shows that as the situation parameter, a rotor speed of an aircraft, is increased from 0 to 450 RPM, an expected cabin noise level attributed to the rotor speed generally linearly increases from 0 to 90 decibels. In some cases, the above-described rotor speed parameter, may be monitored by sensors and/or by accessing a digital data bus of the aircraft information and control system 14 that manages and/or shares rotor speed information.

Referring to the chart of FIG. 5, the weapon initiation situation response model 400 shows that as the situation parameter, elapsed time after weapon initiation, increases from 0 to 500 milliseconds, an expected cabin noise level attributable to the weapon initiation generally increases from 0 decibels at time=0 to about 100 decibels at time=200 milliseconds, increases about 120 decibels at time=250 milliseconds, decreases to about 100 decibels at time=300 milliseconds, and decreases back to 0 decibels at time=500 milliseconds. In other words, FIG. 5 provides a situation response model indicative of the relatively short-lived but high amplitude noise disruption that may occur as a function of initiating a weapon such as a large caliber firearm. In some cases, the above-described weapon initiation parameter may be monitored by sensors and/or by accessing a digital data bus of the aircraft information and control system 14 that manages and/or shares weapons initiation information. The rotor speed situation parameter and the elapsed time after weapon initiation situation parameter may each be considered operational parameters.

Referring to the chart of FIG. 6, the cabin insulation thickness situation response model 500 shows that with an increase in thickness of cabin insulation thickness from about 0.25 inches to about 1.25 inches, an associated reduction in cabin noise may be expected to increase from about 1.0 decibels to about 29 decibels according to a somewhat exponential curve. In some cases, the above-described cabin insulation thickness parameter may be monitored by sensors and/or by accessing a digital data bus of the aircraft information and control system 14 that manages and/or shares cabin insulation thickness parameter information. The cabin insulation thickness situation parameter may be considered a construction and/or structural parameter. In some cases, situation parameter value(s) 106, such as the above-described cabin insulation thickness, may be monitored by providing an input to the audio system 10 indicative of the cabin insulation thickness and/or accessing an aircraft configuration database comprising information related to the physical properties of the aircraft components.

Figure 7:
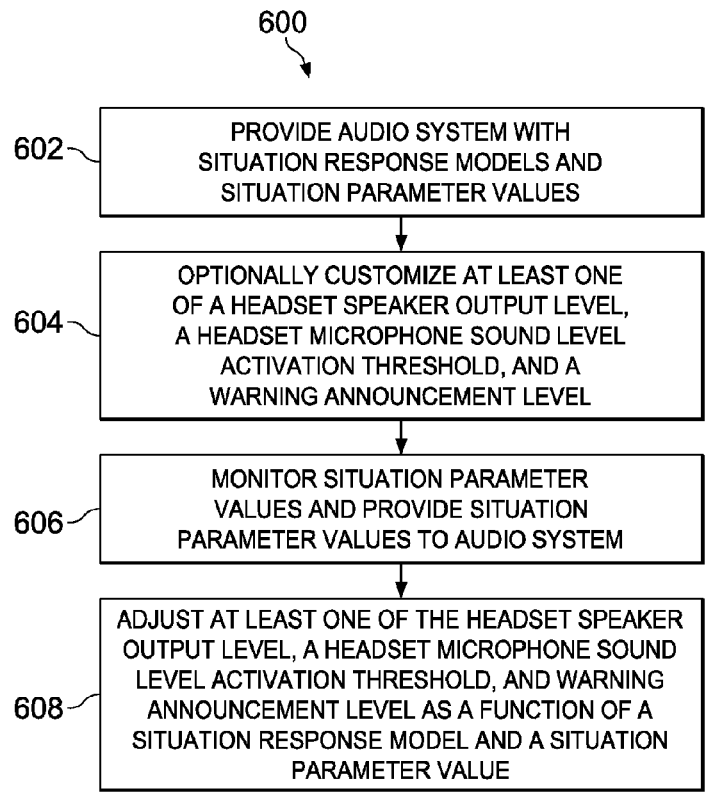
FIG. 7 is a flowchart of another method of controlling the audio system of FIG. 1.
Figure 8:
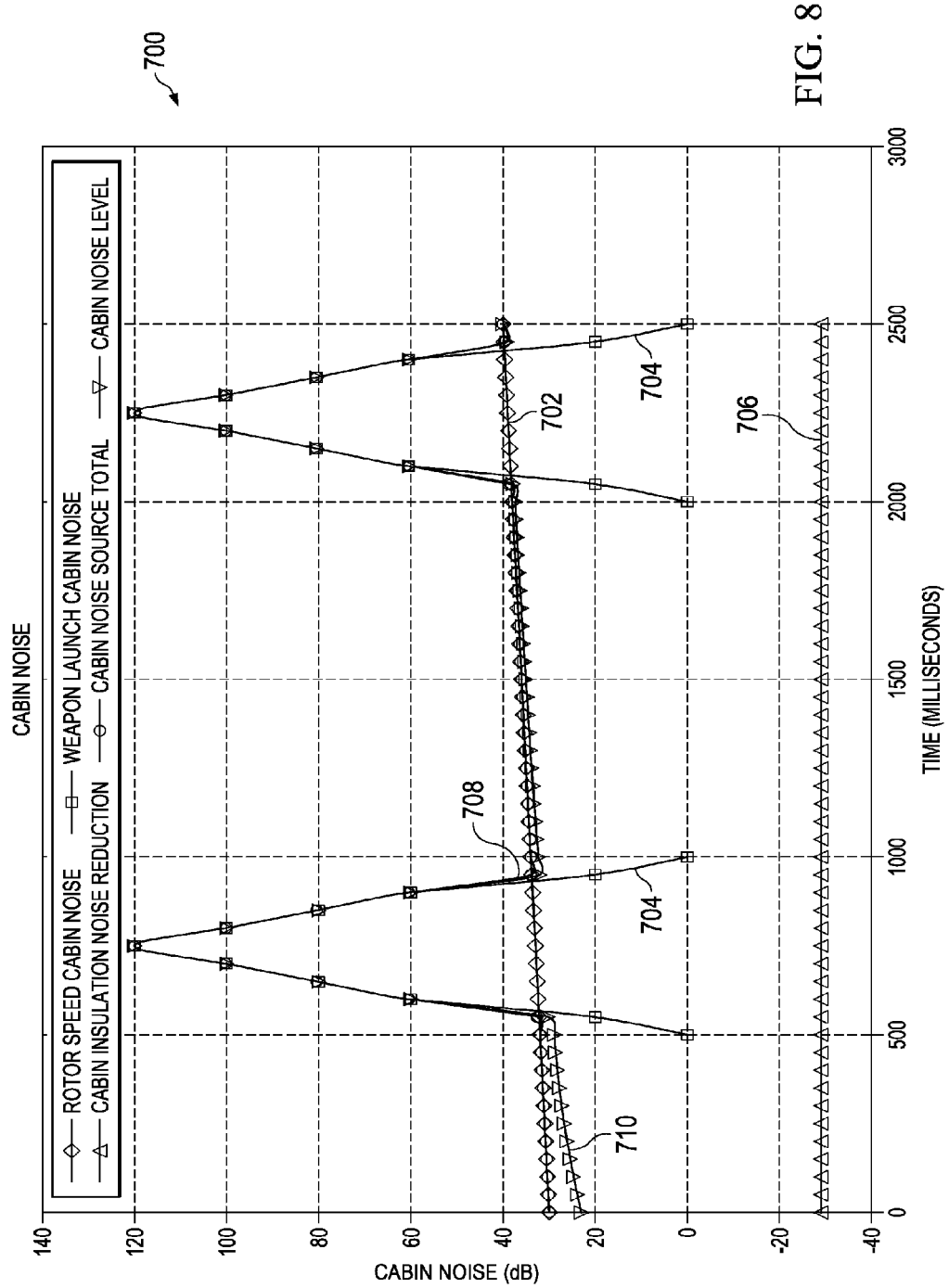
FIG. 8 is a situation response chart associated with the method of FIG. 7 and the situation parameter model charts of FIGS. 4-6.

Referring now to FIGS. 7 and 8, a method 600 of controlling an audio system and an accompanying situation response chart 700 are shown, respectively. The method 600 may begin at block 602 by providing an audio system, such as audio system 10, with situation response models 102, such as situation response models 300, 400, 500 and associated situation parameter values 106. Block 602 of method 600 may be performed substantially similarly to the above-described blocks 202, 204 so that audio system 10 and situation response system 104 of audio panel 12 comprise the information necessary to control at least one of a headset speaker output level, a headset microphone sound level activation level threshold, and a warning announcement level as a function of the situation parameter values 106.

Referring to FIG. 8, a situation response chart 700 is shown as comprising a plurality of situational parameter value curves charted relative to an x-axis representative of time (measured in milliseconds) and a y-axis representative of cabin noise level (measured in decibels). Situation response chart 700 comprises a rotor speed cabin noise curve 702, a weapon initiation cabin noise curve 704, a cabin insulation thickness noise reduction curve 706, a cabin noise source total curve 708, and a cabin noise level curve 710. The values of curves 702, 704, 706 are obtained, in some embodiments, by monitoring and/or recording the situation parameter value(s) 106 during operation of an aircraft comprising the audio system 10. As such, with known situation parameter value(s) 106, associated effects on cabin noise may be determined. Most generally, the example of situation response chart 700 shows a record of an aircraft comprising a cabin insulation thickness of 1.25 inches that linearly increased rotor speed from 200 RPM to 250 RPM from time=0 to time=2,500 milliseconds (2.5 seconds). The situation response chart 700 also shows that the aircraft operated to cause a first weapon initiation at time=500 milliseconds and a second weapon initiation at time=2,000 milliseconds. The cabin noise source total curve 708 represents an additive function of the positive value noise sources, namely curves 702, 704. The cabin noise level curve 710 represents a subtraction of the curve 706 from the curve 708 which yields a total cabin noise level that is attributable to the above-described situation parameters.

The method 600 may progress at block 604 by allowing a user and/or potential recipient of a headset speaker, a sound level threshold activated headset microphone (i.e, VOX microphone), and a warning announcement to set, in some cases via the flight crew audio interface 18, a headset speaker level, a sound level threshold level, and a warning announcement level to values comfortable and/or useful to the user. The values of the level settings may be recorded and/or otherwise stored for future use in the flight crew audio interface 18. The customizations may be stored as relative values compared to other sound and/or noise levels, such as, but not limited to a selected percent louder or quieter as compared to other sound and/or noise levels. Additionally, the customization may be at least partially automated when a user connects a component having known sound performance properties to the audio system 10. For example, a headset may comprise a known set of audio performance characteristics and the audio performance characteristics may be communicated to the audio panel 12 and at least partially accounted for prior to the user providing additional customization level settings via the flight crew audio interface 18.

The method 600 may progress at block 606 by monitoring the above-described situation parameters and obtaining and/or providing situation parameter values 106 to the situation response system 104 of the audio system 10. In some cases, the monitoring may be accomplished by directly tapping a digital data bus that manages and/or shares situation parameter value(s) 106.

The method 600 may progress at block 608 by referencing the obtained situation parameter values 106 in the situation response models 104 and determining, through the application of the models 104 and values 106, an impact the situation parameters may have on cabin noise. After determining an anticipated effect the situation parameters may have on cabin noise, the method 600 may operate to adjust at least one of the headset speaker output level, the headset microphone sound level activation threshold, and the warning announcement level as a function of the respective models 104 and values 106.

In some embodiments, the method 600 may increase the headset speaker output level by an amount sufficient to maintain a substantially constant level of differentiation between the audio output of the headset speaker and the additional cabin noise generated by increasing the rotor speed. Similarly, in some embodiments, the method 600 may increase the headset microphone sound level activation threshold by an amount sufficient to maintain a substantially constant level of differentiation between a desired activating sound source (i.e., a user voice) and the additional cabin noise generated by increasing the rotor speed. Similarly, in some embodiments, the method 600 may increase the warning announcement level by an amount sufficient to maintain a substantially constant level of differentiation between the warning announcement level and the additional cabin noise generated by increasing the rotor speed. In some embodiments, the method 600 may selectively mute the headset microphone, selectively disable the headset microphone sound level activation threshold functionality, and/or selectively pause the above-described attempts to maintain a substantially constant level of differentiation between cabin noise and the audio output of the headset speaker during periods where the cabin noise level is spuriously excessive, such as, but not limited to, periods of high cabin noise levels attributable to weapon initiation (i.e., time=550 milliseconds to time=950 milliseconds and time=1050 milliseconds to time=2450 milliseconds). Such temporary cessations and/or alterations in audio management may avoid transmission of audio output that may not be reliably received and/or may prevent the microphone from being undesirably activated.

In some embodiments, the above-described aircraft may comprise a helicopter, a tilt-rotor, and/or a fixed wing aircraft. In some embodiments, the audio panel 12 may allow a user to selectively adjust listening volumes of an intercommunications system (ICS) and/or radios. In some embodiments, the above-described warning announcements may be associated with aural and/or voice warning systems. In some embodiments, the audio system 10 may be configured for use to manage audio inputs and/or outputs within a modern glass cockpit. In some embodiments, situation parameters may be associated with an airspeed, a rate of decline, a rate of descent, a rotor torque, and/or the like to determine what flight regime the aircraft is operating in such as, but not limited to, cruising at medium power, maximum power diving, hovering, TOP climb, and/or the like to adjust audio inputs and/or outputs as a function of situation response models associated with the flight regimes. In some embodiments, the audio system 10 may be associated with digital bus controlled radios. In some embodiments, audio system 10 may be implemented in conjunction with an audio distribution panel to enhance the communications experience by assuring a situationally and/or preference tailored communications experience. In some cases where a user utilizes multiple radios and selects a preferred radio of the multiple radios to listen to at a slightly higher volume level, audio system 10 may be configured to maintain a relative volume level preference established by the user. In some cases, audio system 10 provides one or more users an overall volume range adjustment to allow each user to compensate for differences such as, but not limited to, individual hearing characteristics, individual headset performance characteristics, personal preference, side to side differences in cockpit/cabin ambient noise levels, and/or the like. In some embodiments the audio system 10 utilizes digital information from a digital bus to improve aircraft communication functions by at least one of automatically adjusting radio listening levels, microphone sound level activation thresholds, and/or warning announcement levels in response to flight regimes, ground regimes, and/or other situation parameters.

In some cases, one or more of the audio systems and/or related methods disclosed herein may be utilized in vehicles other than aircraft. In some embodiments, an audio system substantially similar to audio system 10 may be utilized in a tank, ship, boat, hovercraft, locomotive engine, automobile, and/or any other suitable vehicle. While some of the situation parameters and/or situation response models may be associated with conditions specific to the various vehicles, an audio system of this disclosure may nonetheless operate in substantially the same manner as audio system 10. Further, this disclosure contemplates that an audio system substantially similar to audio system 10 may be configured for use in a non-vehicular environment. For example, an audio system substantially similar to audio system 10 may be configured for use in a noisy manufacturing facility. In some cases, an audio system may be configured so that manufacturing machinery operation is monitored as a situation parameter and the audio system may be configured to adjust an audio signal and/or volume by applying a situation response model specific to the manufacturing machinery operation. In this manner, a user of the audio system that may be wearing a bi-directional communication headset may be provided audio signals and/or voice activated control thresholds that are customized and/or adjusted in response to the situation parameters specific to the manufacturing environment. The audio system may be configured to monitor a location of the user and/or headset to begin or discontinue monitoring and/or responding to particular situation parameters. Most generally, the audio systems disclosed herein may be utilized in substantially any circumstance in which a situation parameter may be identified and utilized to generate a situation response model specific to the situation parameter.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Unless otherwise stated, the term "about" shall mean plus or minus 10 percent of the subsequent value. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

What is claimed is:

1. A method of controlling an audio system of an aircraft, comprising:
   identifying a weapon initiation situation response model that maps expected cabin noise levels attributable to a weapon initiation to a set of values of an elapsed time after the weapon initiation;
   determining an expected cabin noise for a current value of the elapsed time after the weapon initiation based on the weapon initiation response model;
   selecting a volume level adjustment of the audio system to compensate for the determined expected cabin noise in the aircraft; and
   applying the selected volume level adjustment to the audio system, wherein a volume level of the audio system after applying the volume level adjustment is greater than zero volume.

2. The method of claim 1, further comprising generating and storing the weapon initiation situation response model before the weapon initiation.

3. The method of claim 1, further comprising generating and storing the weapon initiation situation response model before a takeoff of the aircraft.

4. The method of claim 1, wherein applying the selected volume level adjustment to the audio system comprises applying the selected volume level adjustment to an audio output of the audio system, or an audio input of the audio system, or both the audio output and the audio input of the audio system.

5. The method of claim 1, wherein applying the selected volume level adjustment to the audio system comprises adjusting the volume level of a speaker of the audio system.

6. The method of claim 1, wherein applying the selected volume level adjustment to the audio system comprises adjusting a sound level threshold associated with enabling reception of a microphone output.

7. The method of claim 1, wherein a variation in the values of elapsed time after the weapon initiation is associated with a variation in a sound level within the cabin.

8. The method of claim 1, comprising determining a current cabin noise value in the aircraft, wherein the expected cabin noise is further based on the determined cabin noise value.

9. The method of claim 1, further comprising:
   identifying one or more situation response models, each situation response model mapping expected cabin noise values to a respective set of values of a situation parameter that affects cabin noise values; and
   wherein determining the expected cabin noise comprises determining the expected cabin noise for (a) the current value of the elapsed time after the weapon initiation based on the weapon initiation response model, and (b) the current value of the situation parameter for the situation response model.

10. An audio system of an aircraft, the audio system comprising:
    a situation response system;
    a weapon initiation situation response model that maps expected cabin noise levels attributable to a weapon initiation to a set of values of an elapsed time after the weapon initiation; and
    wherein the situation response system is configured to:
       determine an expected cabin noise for a current value of the elapsed time after the weapon initiation based on the weapon initiation response model,
       select a volume level adjustment of the audio system to compensate for the determined expected cabin noise in the aircraft, and
       apply the selected volume level adjustment to the audio system, wherein a volume level of the audio system after applying the volume level adjustment is greater than zero volume.

11. The audio system of claim 10, wherein the selected volume level adjustment is applied to an audio output of the audio system, or an audio input of the audio system, or both the audio output and the audio input of the audio system.

12. The audio system of claim 10, wherein a variation in the values of elapsed time after the weapon initiation is associated with a variation in a sound level within the cabin.

13. The audio system of claim 10, further comprising:
    one or more situation response models, each situation response model mapping expected cabin noise values to a respective set of values of a situation parameter that affects cabin noise values; and
    wherein situation response system is configured to determine the expected cabin noise for (a) the current value of the elapsed time after the weapon initiation based on the weapon initiation response model, and (b) the current value of the situation parameter for the situation response model.

14. The audio system of claim 10, wherein the situation response system is configured to receive digital data associated with at least one of the weapon initiation response model and the values of the elapsed time after the weapon intuition from a digital bus.

15. An audio system for an aircraft, comprising:
    an aircraft information and control system configured to provide values of elapsed time after a weapon initiation;
    an audio panel configured to provide a weapon initiation situation response model that maps expected cabin noise levels attributable to the weapon initiation to the provided values of the elapsed time after the weapon initiation, so as to determine an expected cabin noise for a current value of the elapsed time after the weapon initiation based on the weapon initiation response model, and select a volume level adjustment of the audio system based on the expected noise in the aircraft; and
    a flight crew audio interface configured to adjust a volume level of the audio system using the volume level adjustment, wherein the volume level of the audio system after applying the volume level adjustment is greater than zero volume.

16. The audio system of claim 15, further comprising:
a digital bus connection the aircraft information and control system to the audio panel; and
an avionics system configured to provide information to the audio panel.

17. The audio system of claim 15, wherein the flight crew audio interface provides a volume preference parameter to the audio panel and the volume level adjustment is also based on the volume preference parameter.

18. The audio system of claim 15, wherein the selected volume level adjustment is applied to an audio output of the audio system, or an audio input of the audio system, or both the audio output and the audio input of the audio system.

19. The audio system of claim 15, wherein a variation in the values of elapsed time after the weapon initiation is associated with a variation in a sound level within the cabin.

20. The audio system of claim 15, wherein:
the aircraft information and control system is further configured to provide values of elapsed time after a weapon initiation and values of a situation parameter that affects cabin noise; and
the audio panel is further configured to provide one or more situation response models, each situation response model mapping expected cabin noise values to a respective set of values of the situation parameter, and the expected cabin noise is determined for (a) the current value of the elapsed time after the weapon initiation based on the weapon initiation response model, and (b) the current value of the situation parameter for the situation response model.

* * * * *